METHOD FOR PRODUCING SEMICONDUCTOR DEVICES

Filed Feb. 1, 1960 5 Sheets-Sheet 1

INVENTORS.
ROBERT E. HUNT,
ROBERT C. INGRAHAM
and WILLIAM J. PIETENPOL
BY Elmer J. Nealon
ATTORNEY.

METHOD FOR PRODUCING SEMICONDUCTOR DEVICES

Filed Feb. 1, 1960 5 Sheets-Sheet 2

INVENTORS.
ROBERT E. HUNT,
ROBERT C. INGRAHAM
and WILLIAM J. PIETENPOL
BY Elmer J. Nealon
ATTORNEY.

INVENTORS.
ROBERT E. HUNT,
ROBERT C. INGRAHAM
and WILLIAM J. PIETENPOL
BY Elmer J. Nealon
ATTORNEY.

INVENTORS.
ROBERT E. HUNT,
ROBERT C. INGRAHAM
and WILLIAM J. PIETENPOL
BY Elmer J. Nealon
ATTORNEY.

INVENTORS.
ROBERT E. HUNT,
ROBERT C. INGRAHAM
and WILLIAM J. PIETENPOL
BY Elmer J. Nealon
ATTORNEY.

United States Patent Office 3,066,053

Patented Nov. 27, 1962

3,066,053
METHOD FOR PRODUCING SEMICONDUCTOR DEVICES

Robert E. Hunt, Reading, Robert C. Ingraham, Topsfield, and William J. Pietenpol, Winchester, Mass., assignors to Sylvania Electric Products Inc., a corporation of Delaware Filed Feb. 1, 1960, Ser. No. 5,826
8 Claims. (Cl. 148—1.5)

This invention relates to semiconductor electrical translating devices and more particularly to methods for producing devices of the type having a semiconductor body with an elevated portion or mesa containing the electrically active region of the device.

One type of semiconductor device which appears to have particularly desirable electrical characteristics and also to be amenable to mass-production techniques of manufacture is the mesa transistor; so-called because of the physical configuration of the semiconductor body in the finished device. In the fabrication of mesa transistors according to presently known techniques an ingot of a semiconductor material of the desired conductivity type, for example P-type germanium, is prepared in the usual well known manner and then divided into thin slabs or slices. Each slab is then treated in a diffusion furnace in order to diffuse an N-type conductivity type imparting impurity into the slab and convert a thin layer at each surface to N-type conductivity. A slab is then mounted in suitable vacuum evaporation and alloying apparatus with a mask having a plurality of apertures located adjacent but spaced from one of the major surfaces of the slab. Each aperture is generally rectangular in shape with dimensions of the order of a few mils. Several hundred apertures are arranged in a regular pattern over the mask. Appropriate materials are placed in filaments at two suitable locations within the apparatus, the apparatus is evacuated, and then the materials are evaporated. Vapors of the materials pass through the apertures in the mask and condense on the surface of the slab to form at each aperture a pair of rectangular deposits or stripes of the evaporated materials which are subsequently alloyed into the slab. One of the materials is an N-type conductivity imparting impurity and forms ohmic metallic base contacts to the N-type diffused layer. The other material is a P-type conductivity imparting impurity and converts portions of the N-type diffused layer to P-type material to form emitter regions and contacts thereto.

After the emitter and base stripes have been deposited on a surface and alloyed into the slab, that surface of the slab is coated with a resistant material and immersed in an etching solution to remove the diffused N-type layer from the opposite major surface and to reduce the thickness of the slab. The resistant material is then removed from the slab. The surface of the slab is scribed to produce intersecting sets of grooves separating each pair of stripes, and the slab is broken into a plurality of individual dice each containing a pair of stripes. Each die is brazed in position on a gold-plated header thus forming an ohmic connection with the P-type collector region of the mass of the die. Resistant material is placed carefully over the stripes and a very small area of the surface of the die surrounding the stripes, and the die and header are immersed in an etching solution. The etching action dissolves the exposed portions of the N-type layer and causes a small mesa or pedestal containing the stripes and an N-type layer to be formed in the die. The area of the mesa as defined by the resistant material is made as small as possible since certain desirable electrical characteristics in the final device are directly dependent on the area of the P-N junction in the mesa.

After the mesa has been formed, the resistant material is removed and connections are made from each of the stripes to an appropriate lead on the header. Then the device is suitably etched, cleaned, and sealed to provide the completed transistor.

In the fabrication of mesa semiconductor devices according to the foregoing method it is necessary to define and protect the area of the mesa on each die separately and individually. The resistant material must be carefully applied, generally by hand, to only one device at a time. This operation is inefficient not only because of the time required but also because of the difficulty of obtaining accurate registration between the resistant coating defining the mesa and the stripes while holding the area of the mesa to a minimum.

Therefore, it is an object of the present invention to provide an improved method for producing semiconductor devices of the mesa type.

It is a more specific object of the invention to provide a method for forming all the means on a semiconductor slab simultaneously prior to separating the slab into individual dice whereby improved registration between the mesas and the stripes is obtained and the areas of the mesas are uniformly controlled.

Briefly, in accordance with the objects of the invention a mask having a plurality of apertures therein is placed at a predetermined distance from one surface of a slab of semiconductor material which is largely of one conductivity type and has a layer of the opposite conductivity type at the surface. A first conductivity type imparting material and a second conductivity type imparting material capable of imparting the type of conductivity opposite to said first material are deposited through the apertures and alloyed with the layer. These materials define a plurality of pairs of regions on the surface of the slab corresponding to the number of apertures in the mask, one region of each pair coating the first material and the other region of each pair containing the second material. Next, without altering the relative positions of the mask and slab, an etch resistant material is deposited through the apertures in the mask to define on the surface of the slab a plurality of areas coated by the resistant material, each of which includes one of the pairs of regions. By virtue of the maintenance of the same relative positions of mask and slab excellent registration is obtained between each coated area and its associated pair of regions. The slab then is immersed in an etching medium which is capable of dissolving the semiconductor material but not the resistant material. A plurality of pedestals or mesas each including one of the pairs of regions are thereby formed. The slab is subsequently divided into a plurality of individual, discrete elements or dice each of which includes one of the pedestals.

Although the foregoing general explanation of the method of the invention and the following specific description of the method are given in reference to the production of transistor type devices, it is to be understood that features of the method are effective with respect to the production of other types of semiconductor devices. For example, diodes, in which only a single rectifying junction is desired, may be produced by deposition of only a single region of conductivity type imparting material on the semiconductor slab.

The method of the invention together with additional objects, features, and advantages thereof may best be understood from the following detailed discussion and the accompanying drawings wherein.

Figure 1:
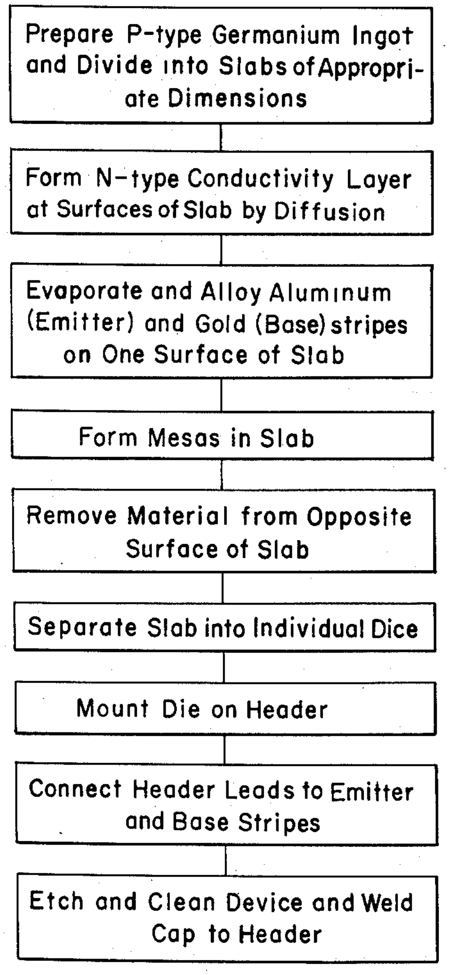
FIG. 1 is a flow chart summarizing the processing steps followed in carrying out the fabrication of P-N-P germanium mesa transistors according to the method of the invention.

Because of the extremely small size of various portions of the device and of certain portions of the apparatus, some of the dimensions of many of the elements in the drawings have been exaggerated with respect to other dimensions. It is believed that greater clarity of presentation is thereby obtained despite consequent distortion of elements in relation to their actual physical appearance.

The process of producing mesa transistors according to the invention is outlined in FIG. 1 of the drawings. For ease and clarity in presentation the fabrication of P-N-P germanium transistors is described although the method of the invention is obviously more widely applicable. First, a germanium ingot of P-type conductivity is grown according to known techniques and divided into slices of regular rectangular configuration. The slices are lapped, polished, and etched to provide slabs of suitable thickness and desired surface conditions. Each slab is then treated in a diffusion furnace according to known techniques to diffused an N-type conductivity imparting material into the slab and convert a thin surface layer to N-type conductivity.

Figure 2:
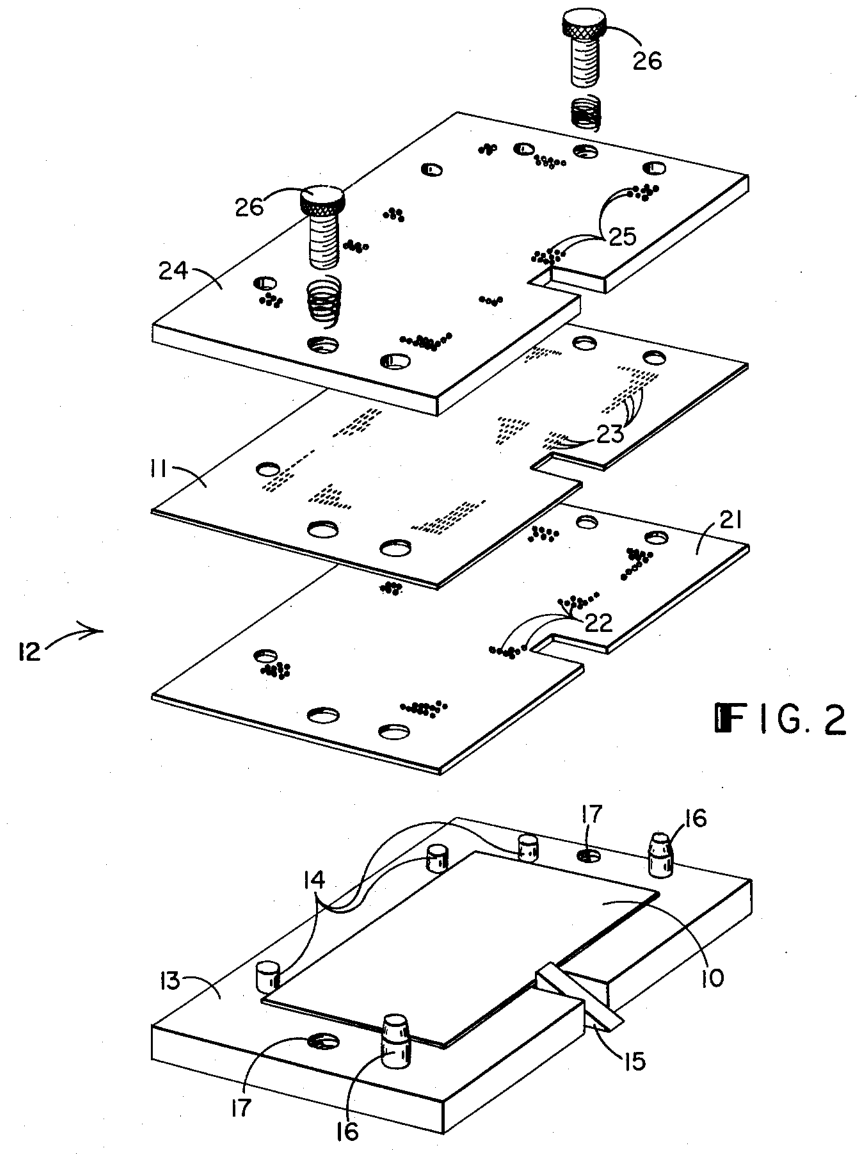
FIG. 2 is an exploded view in perspective of a semiconductor slab and mask together with the masking jig for holding them in proper alignment during processing according to the method of the invention.

A slab 10 is then assembled with a mask 11 in a masking jig 12 as shown in FIG. 2. The base 13 of the jig includes an arrangement of three positioning pins 14 which the slab abuts when placed on the base. A spring loaded clip 15 urges the slab against two of the positioning pins and holds it firmly in position on the base. The base also includes two alignment pins 16 and two threaded holes 17 for positioning and holding the mask and other parts of the jig. A spacer plate 21 of a precise thickness having suitable holes which mate with the positioning and alignment pins and coincide with the threaded holes in the base is placed on top of the slab 10. The spacer plate has a plurality of apertures 22 arranged in a regular rectangular pattern over the portion of the spacer which covers the slab. Next, the extremely thin mask 11 also having holes which mate with the positioning and alignment pins and coincide with the threaded holes is placed over the spacer plate. The mask has a plurality of rectangular apertures 23 which are much smaller than the apertures in the spacer and which are arranged so that each of the apertures registers with a spacer aperture. A hold-down plate 24 is then placed on top of the mask. This plate also has holes which mate with the positioning and alignment pins and coincide with the threaded holes. A plurality of apertures 25 in the hold-down plate of approximately the same size as those in the spacer plate are arranged so as to register with the apertures in the mask and spacer. The jig is firmly assembled to hold the slab and all the elements in alignment by means of spring loaded retaining screws 26 threaded into the holes 17 in the base.

Figure 3:
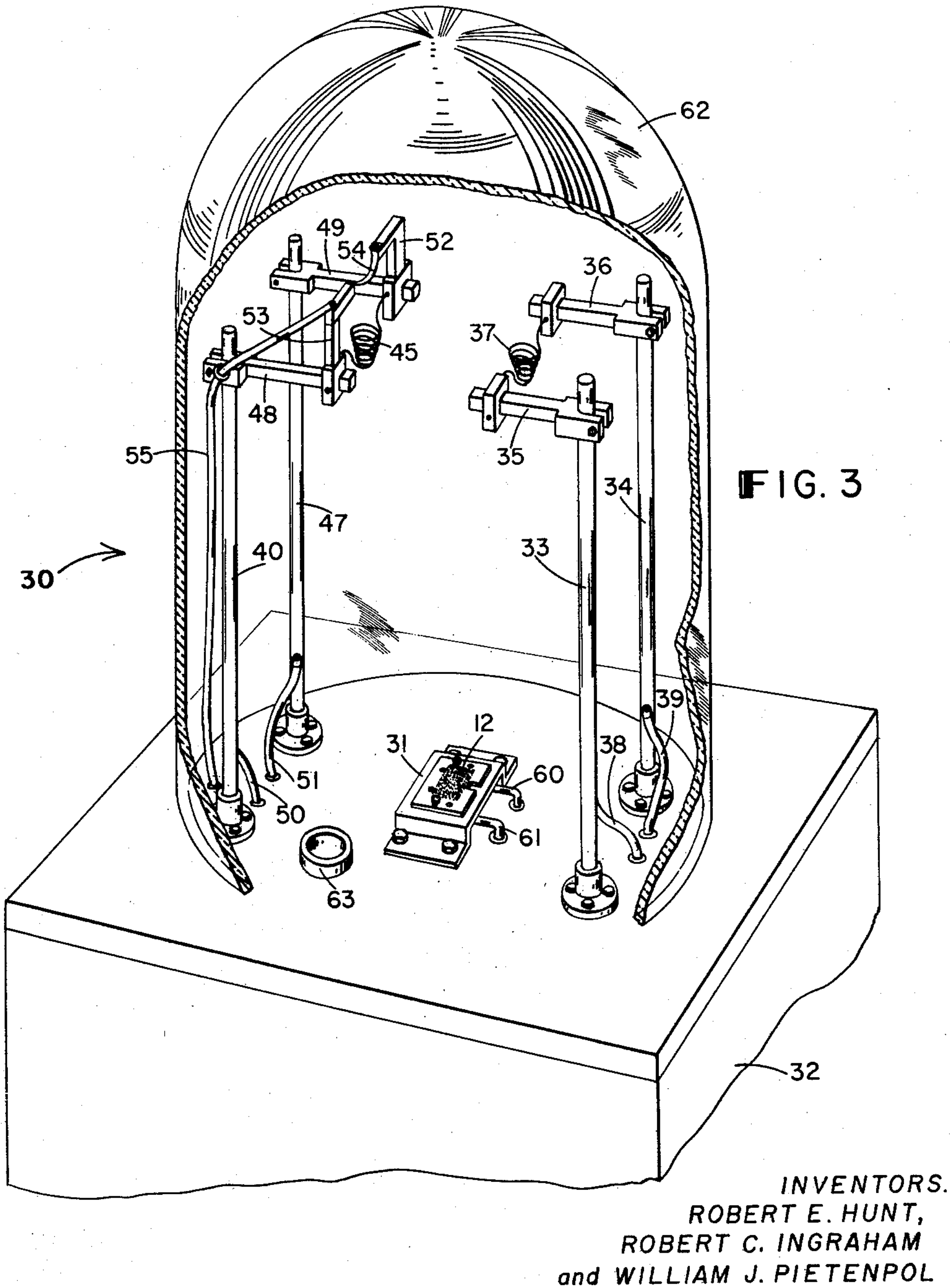
FIG. 3 is a perspective view of apparatus showing the essential elements employed in depositing the base and emitter stripes on the masked slab and in alloying the materials of the stripes into the slab.

The assembled masking jig 12 is placed in the vacuum evaporation and alloying apparatus 30 of FIG. 3 in order to deposit and alloy emitter and base stripes on the slab. A holder 31 for supporting the jig in position is mounted on the base 32 of the apparatus. Two vertical rods 33 and 34 which are firmly mounted on and electrically insulated from the base have horizontal supports 35 and 36 which are adjustably clamped thereto. A conical basket filament 37 of a material such as tungsten which serves as the source for one of the stripe materials is suspended between the two supports so as to be movable parallel thereto. Electrical leads 38 and 39 which enable the filament to be heated by an electric current are connected to the vertical rods and are carried externally of the apparatus through lead-in electrodes in the base 32. A second conical basket filament 45 which serves as the source for the other stripe material is similarly movably supported by insulated vertical rods 46 and 47 and horizontal supports 48 and 49. Electrical leads 50 and 51 for heating this filament are connected to the rods and lead-in electrodes in the base. The filaments are sufficiently distant from the masked slab so that they are, in effect, point sources. The two filaments are arranged above one of the center lines of the slab and on opposite sides of the other center line of the slab. An extension arm 52 is connected both electrically and mechanically to one of the supports 49 for the second filament, and another extension arm 53 is connected mechanically but insulated electrically from the other support 48. A strip of fuse metal 54 is connected between the ends of these two arms. These arms are positioned so that the fuse metal strip lies directly above the filament. The insulated arm 53 is connected to a lead 55 which is connected to a lead-in electrode sealed in the base 32.

Two other leads 60 and 61 sealed through and insulated from the base of the apparatus are connected to an electrical heating element (not visible) beneath the masking jig holder 31. A bell jar 62 is placed on the base to form an hermetic seal thereto and provide a closed chamber surrounding the various elements of the apparatus. Air is evacuated from the chamber through an outlet 63 which is connected to a suitable vacuum pump system (not shown).

After the slab has been placed in the masking jig 12, the jig is positioned in the holder 31 with the long dimensions of the rectangular apertures in the mask transverse to a line between the two filaments. A charge of aluminum wire, a P-type conductivity imparting material, in the form of a coil is placed in the first filament 37, and a charge of gold-antimony wire in the form of a coil is placed in the second filament 45. Gold is generally considered as a neutral material and antimony imparts N-type conductivity to germanium. A coil of gold wire and a coil of silver wire are strung on the fuse metal strip 54. After the charges of stripe materials and the mask and slab are in position, the bell jar is placed on the base and the apparatus is evacuated. The pressure in the chamber is reduced to about $10^{-5}$ millimeters of mercury or less.

Figure 4:
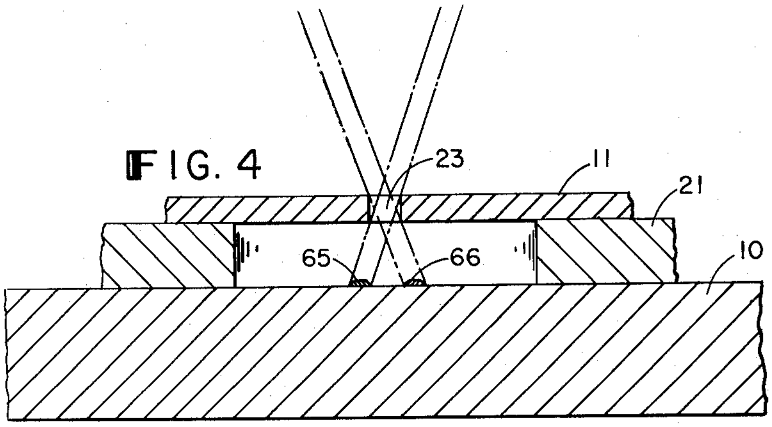
FIG. 4 is a view in cross-section of a portion of the semiconductor slab and mask illustrating the manner in which vapors of the stripe materials pass through an aperture in the mask and condense on the surface of the slab.

After a suitable vacuum has been obtained, the temperature of the germanium slab is raised slightly by the electrical heater connected to the leads 60 and 61. Electrical power is then applied to the leads 38 and 39 to heat the first filament and vaporize the aluminum. The aluminum vapors travel outward from the source in straight lines and impinge on the germanium slab as permitted by the apertures in the mask. Shields may be suitably located around the filaments in order to reduce the amount of material which condenses on the bell jar and other portions of the apparatus. FIG. 4 illustrates at any one aperture 23 the manner in which the aluminum vapors pass through an aperture in the mask 11 and strike the surface of the slab, where they condense and form a stripe 65. Because of the angle at which the vapors emanating from the source pass through the aperture and impinge on the surface of the slab, the aluminum stripe 65 is displaced from the position directly below the aperture 23 in the direction away from the aluminum source.

When the aluminum charge has been evaporated, the current through the first filament is turned off and the temperature of the germanium slab is raised to alloy the aluminum stripes with the germanium in the regions of the surface layer adjacent the stripes. The alloying of each aluminum stripe with the N-type germanium converts a region to P-type conductivity. The germanium slab is allowed to cool, and then electrical energy is applied to the leads 50 and 51 to heat the second filament 45 and vaporize the gold-antimony charge. The angle at which the gold-antimony vapors that condense on the germanium surface travel from the source and pass through each aperture causes the gold-antimony stripe 66 to be displaced from the position directly beneath the aperture as shown in FIG. 4 so as to lie closely adjacent but spaced from the aluminum stripe 65. The current in the second filament is turned off and the temperature of the germanium is raised to a suitable point, which is below the alloying temperature of germanium and aluminum, in order to alloy each gold stripe 66 to the slab and thus form an ohmic contact to the N-type diffused layer. The temperature of the germanium slab is reduced, and an electrical current is passed through leads 55 and 51 to melt the fuse metal strip 54 and drop the charge of gold and silver wires into the second basket filament 45. Current again is passed through leads 50 and 51 heating the second filament and evaporating first the silver and then the gold. The vapors condense to form a layer of silver and then a layer of gold on each of the gold stripes. These additional layers serve to protect the gold stripes from damage during subsequent high temperature processing, as will be explained in more detail hereinafter.

After the stripes have been deposited on the germanium slab and alloyed thereto, the slab is allowed to cool, pressure within the chamber is increased to normal, the apparatus is opened, and the masked slab is removed from the holder frame. Next, according to the method of the invention, a plurality of mesas each including the pair of stripes deposited through a single aperture are formed in the slab. The area of each mesa on the surface of the slab is defined by a resistant coating applied to the surface by the vacuum evaporation apparatus 70 of FIG. 5. This apparatus includes a base 71 to which two vertical support rods 72 and 73 are firmly attached. The masking jig 12 with the arrangement of the slab and mask undisturbed with respect to each other, is placed with the apertures downward in a holding frame 74 which is adjustably clamped to the vertical rods. The long dimensions of the rectangular apertures lies in a direction parallel to a line between the two rods. A wire mesh screen 75 is located beneath the holding frame. It is secured in this position between two clamps 76 and 77 which, as shown, are mounted on conductive posts insulated from and sealed through the base of the apparatus. A bell jar 78 fits over the apparatus and forms an hermetic seal to the base to provide a chamber surrounding the masked slab and screen source. The chamber is evacuated through an outlet 79 by means of a suitable vacuum pump system (not shown).

The screen source 75 is coated with a suitable vaporizable etch resistant material as, for example, any one of several types of masking waxes which will form adherent and continuous deposits on the germanium slab. After the masked slab and coated source are in position, the apparatus is evacuated to a pressure of about $10^{-5}$ millimeters of mercury or less. Sufficient electrical current is passed through the clamps 76 and 77 to heat the screen source 75 and evaporate the wax. Wax vapors radiate in straight lines from all points on the surface of the screen, those striking the surface of the slab condensing in a pattern as permitted by the apertures in the mask.

The area of each deposit is determined by the dimensions of the apertures and also by the dimensions of the screen, which is the source of the wax vapors, and the distance of the source from the mask. In order to obtain proper electrical characteristics in the final device each deposit should cover both stripes in the pair together with the area between them and a minimum of area surrounding the stripes. As can be seen from FIGS. 3 and 4 any area source which extends laterally beyond lines drawn between each of the two conical basket filaments and an aperture will provide a wax deposit wide enough to extend across the pair of stripes at that aperture. Similarly, if the wax source has a finite dimension along the length of the aperture which extends beyond lines drawn from either filament to each end of the aperture, the source will provide a wax deposit long enough to extend across the length of the stripes at that aperture. In actual practice, the area of the source should provide a wax deposit of sufficient size to insure a minimum margin of wax around the stripes and thereby provide for some undercutting of the wax deposit during formation of the mesa by etching.

Figure 6:
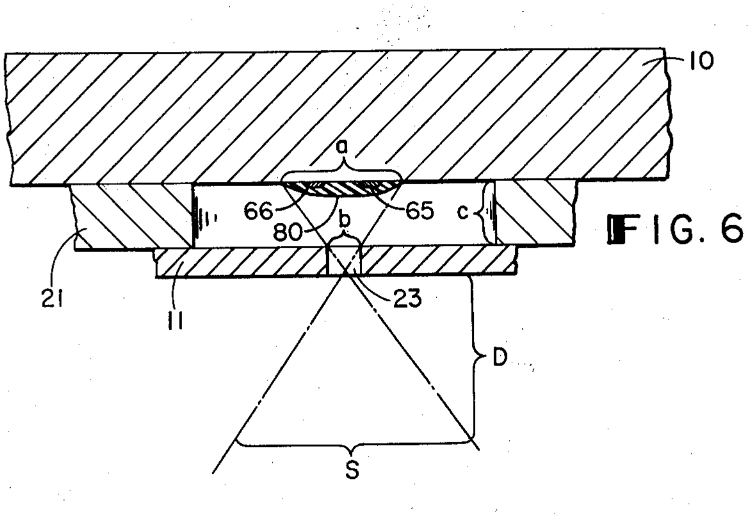
FIG. 6 is a view in cross-section of a portion of the semiconductor slab and mask illustrating the manner in which vapors of the resistant material pass through an aperture in the mask and condense on the surface of the slab to define each mesa.

The manner of calculating the dimensional factors pertaining to the wax source in order to obtain wax deposits of any particular desired dimensions can be shown in conjunction with FIG. 6. If $a$ is one of the dimensions of a wax deposit 80, $b$ one of the dimensions of the aperture, and $c$ the thickness of the spacer, then from the geometry of similar triangles it can be shown that $$\frac{D}{S+b}=\frac{c}{a-b}$$

where S is the dimension of the source and D is the distance of that source from the mask. If the source extends beyond the broken lines, as shown in FIG. 6, established by this relationship, then the dimension of the wax deposit will be larger than desired; if the source does not extend to the lines, then the dimension of the wax deposit will be less than desired. Thus, for any aperture and spacer the distance from the source to the mask and the dimensions of the source in each direction can be calculated to give the desired area for the wax deposit. The dimensions of the wax source and its distance from the masked slab are made very large in relation to the pertinent dimensions at the masked slab in order to minimize variations in the location of each wax deposit with respect to its associated aperture.

Because of various factors involved in the actual practice of vacuum depositing wax on a slab, some slight adjustments in the source dimensions and location as computed are frequently necessary. The factors which are to be compensated for include the bending of the paths of travel of the wax vapors as they pass through the narrow apertures, the spattering of the wax as the vapors strike the surface of the slab, and the clarity of definition at the edges of the wax deposits. Necessary changes are made on the wax source and its distance from the mask by trial and error while the relationships between the mask, spacer, and slab remain unaltered. Thus, extremely small changes in the wax deposits on the slab can be obtained through relatively large, easily controlled adjustments at the wax source. Once the desired wax deposits are obtained, the dimensions and location of the wax source are fixed for all masked slabs having the same size aperture and the same thickness of spacer plate.

Figure 6A:
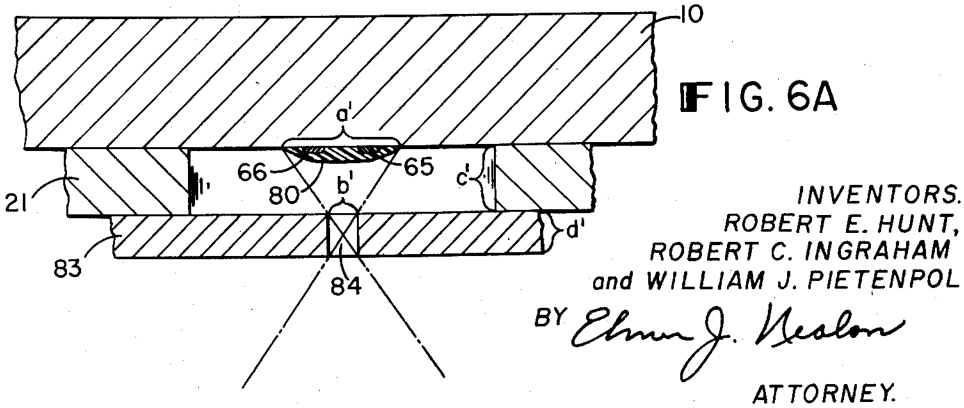
FIG. 6A is a view in cross-section of a portion of a semiconductor slab arranged with a different mask and illustrating an alterantive manner of defining the area of a mesa on a semiconductor slab with the resistant material.

FIG. 6A illustrates a technique that may be employed to regulate the size of the wax deposits defining the mesas essentially independent of the size and location of the wax source. The source need only be of a certain minimum size in relation to its distance from the masked slab. In this technique the thickness of the mask 83 together with one of the dimensions of an aperture 84 and the spacer thickness serve to determine one of the calculated dimensions of each wax deposit. From the geometry of similar triagles it may be shown that $$a'=b'\left(\frac{2c'}{d'}+1\right)$$

where $a'$, $b'$, and $c'$ are the dimension of the wax deposit, the dimension of the aperture, and the thickness of the spacer respectively, and $d'$ is the thickness of the mask. Since the amount of extension of the source beyond the broken lines, as shown in FIG. 6A, is immaterial in determining the dimension of the wax deposit, the source may be considered as infinite and neither its dimension nor location need be carefully controlled. This technique can not be used in defining both the length and width of the wax deposit, unless all the dimensions of the aperture and wax deposit are proportional. In this modification of the method of the invention it is also necessary to make adjustments by trial and error in order to compensate for various factors which cause variations between the actual and calculated results.

After the coating of wax has been appropriately deposited over each pair of stripes on the surface of the slab to define and protect the surface area of each mesa, the masked slab is removed from the coating apparatus 70 and the slab of germanium is separated from the masking jig. The slab is completely immersed in an etching solution which is capable of dissolving germanium but does not attack the wax. The slab is exposed to the etching solution for sufficient time to insure that the diffused layer has been etched away except in the regions beneath the wax deposits.

Figure 7:
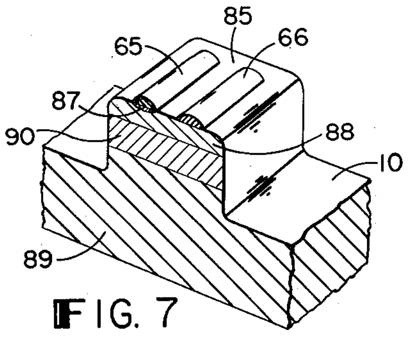
FIG. 7 is a perspective representation in cross-section of a portion of an element or die having the mesa formed therein by following the method of the invention.

A representation of a portion of the slab including one of the mesas or pedestals 85 formed by etching is shown in the cross-section view of FIG. 7. The alloyed aluminum and germanium adjacent the aluminum stripe 65 form the P-type emitter region 87, and the alloyed gold stripe 66 forms an ohmic contact to the diffused N-type base region 88. Between the diffused base layer and the mass of the body of P-type material which is the collector region 89 there is a section 90 which is normally a part of the P-type region but becomes depleted of charge carriers when operating voltages are applied to the device. All of the rectifying junctions which define the active region of the device lie within the mesa. The area of the collector-base junction and consequently the electrical characteristics of the device dependent on the area of that junction are determined by the area of the mesa. Thus, controlling the size of the wax deposit which defines the area of the mesa is particularly important.

It may be desirable to reduce the thickness of the slab prior to further processing if the subsequent processing steps will not in themselves provide a germanium die in the final device which is of the desired thickness. In such a case, a coating of resistant wax may be applied to all of the face of the slab containing the mesas, and the slab immersed in an etching solution for a period of time sufficient to reduce the slab to the desired thickness. The wax coating then is removed from the mesa face of the slab by washing the slab in a suitable solvent and the slab is ready to be separated into individual dice or elements.

The slab may be divided into dice by the well known technique of scribing grooves in one surface and then breaking the slab along the scribed grooves. Another technique which has certain advantages over scribing includes depositing a coating of wax over each mesa and the surrounding area of the face of the slab to define the area of each die and then immersing the slab in an etching solution to dissolve away all of the slab except for the individual protected sections. In this later technique, a mask which has a plurality of apertures of the same size as the dice desired is placed in contact with the face of the slab. Each mesa fits within one of the apertures and since the apertures are large relative to the areas of the mesas, exceptionally careful alignment is not essential in order for the mesas to fit within the apertures. The masked slab is then treated in a wax evaporation apparatus similar to that shown in FIG. 5, or the masked face is sprayed with a resistant wax. The mask is removed and the slab with adherent wax deposits covering each mesa and defining each die is immersed in an etching solution capable of dissolving germanium but not the wax. As the etching solution dissolves germanium through the voids in the wax coating on the mesa face of the slab it also dissolves germanium at the unexposed opposite surface of the slab. Thus, as the dice are formed each also is reduced in thickness. The wax coating is removed from each of the dice by washing them in a suitable solvent.

Figure 8:
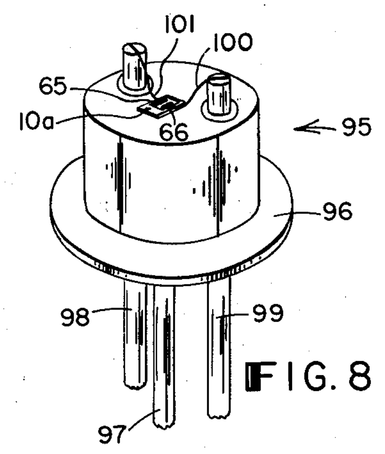
FIG. 8 is a perspective view of a mesa transistor showing a die mounted on a suitable header with connections between the stripes and the appropriate header leads.

Each die or element 10*a* which has a mesa including a pair of stripes is then mounted on a header 95 as shown in FIG. 8. The header includes a base 96 having one lead 97 connected directly thereto. Two other leads 98 and 99 are sealed through the base and insulated therefrom. These two leads have portions extending above the surface of the base. The metallic parts of the header are all gold-plated. The germanium element is gold-brazed to the surface of the base in a hydrogen atmosphere and an ohmic connection is thereby formed between the P-type collector region and the lead 97. The bottom gold layer of the gold stripe 66 alloys with the germanium, but since silver does not alloy with gold or germanium at the brazing temperature employed, the upper layer of gold is not disturbed by the brazing operation. A fine gold contact wire 100 is then connected between the gold stripe and one of the leads 99. Another gold wire 101 is similarly connected between the remaining lead 98 and the aluminum stripe 65. The gold wires are attached to the stripes and leads by known techniques of compression bonding while the germanium die is heated. The transistor is then ready for final processing steps such as etching, cleaning, baking, and sealing of a suitable cap or cover to the header base.

In the fabrication of germanium mesa transistors of a particular type, germanium doped with indium to provide P-type conductivity of between .18 and .25 ohm-centimeter resistivity is formed into an ingot of single crystal material. The ingot is divided into wafers which are ground, lapped, polished, and etched to form a rectangular slab of about .760 by 1.010 inches and 5.5 mils thick. The slab is treated in a diffusion furnace to diffuse arsenic vapors into the germanium to a depth of about .05 mil at all the surfaces and provide an N-type layer having a surface sheet resistance of about 150 ohms per square centimeter. The slab is also treated to out-diffuse some of the arsenic and increase the sheet resistance at the surface to 200 ohms per square centimeter.

The slab is then assembled in a masking jig 12 as shown in FIG. 2. A spacer plate 21 2.5 mils thick having a regular pattern of 500 round apertures each 20 mils in diameter is placed over the slab. A mask 11 which is 1 mil thick is then placed over the spacer plate. The mask has a similar pattern of apertures but each is in the form of a rectangular slot 1 mil by 6 mils. A relatively heavy hold-down plate 24 having a similar arrangement of 20 mil diameter apertures is placed over the mask, and the assembled parts are rigidly held in alignment by retaining screws 26. The 20 mil apertures in the spacer and hold-down plates make it possible for these parts to perform their intended functions and not interfere with the deposition of the metal stripes or wax coatings.

In the vacuum evaporation and alloying apparatus 30 shown in FIG. 3 the conical basket filaments 37 and 45 are placed approximately 4 inches apart and 8 inches from the masked slab. The exact distances are adjusted by trial and error in order to obtain the proper spacing between the stripes on the slab. Once the proper settings have been obtained, however, no further adjustments are necessary for processing subsequent slabs in masking jigs of the same dimensions. A piece of aluminum wire 25 mils in diameter and 21 inches long is formed in a coil and placed in the first filament 37. A piece of gold-antimony wire (99.9% gold, 0.1% antimony) 25 mils in diameter and 2 inches long is also coiled and placed in the second filament 45. A piece of gold-antimony wire 25 mils in diameter and 10 inches long and a piece of silver wire 15 mils in diameter and 7½ inches long are each coiled and strung on the strip of fuse metal 54.

When the apparatus has been properly prepared, it is evacuated to a pressure of $10^{-5}$ millimeters of mercury or less. The temperature of the germanium slab is raised to about 150° C. and current is passed through the first filament 37 for a short period of time to vaporize the aluminum which condenses on the slab in a plurality of stripes 65 in the manner shown in FIG. 4. The temperature of the germanium slab is raised to about 565° C. to cause the aluminum to alloy with the germanium and form the P-type emitter regions 87. As soon as the temperature of 565° C. is reached (a period of about 10 to 15 minutes), the germanium is allowed to cool to about 150° C. The gold-antimony wire is then evaporated from the second filament 45 and the temperature of the slab is raised to 370° C. in order to alloy the gold-antimony with the germanium. The temperature of the slab is then permitted to drop to 150° C. The gold and silver wires are dropped into the second filament by melting the fuse metal strip 54 and current is passed through the second filament again. The silver vaporizes first and forms a silver layer on each gold stripe, and then the gold vaporizes and forms another layer of gold on each stripe 66. The gold and aluminum stripes deposited on the slab are each about 0.9 mil by about 6 mils and they are spaced apart approximately 0.5 mil.

Figure 5:
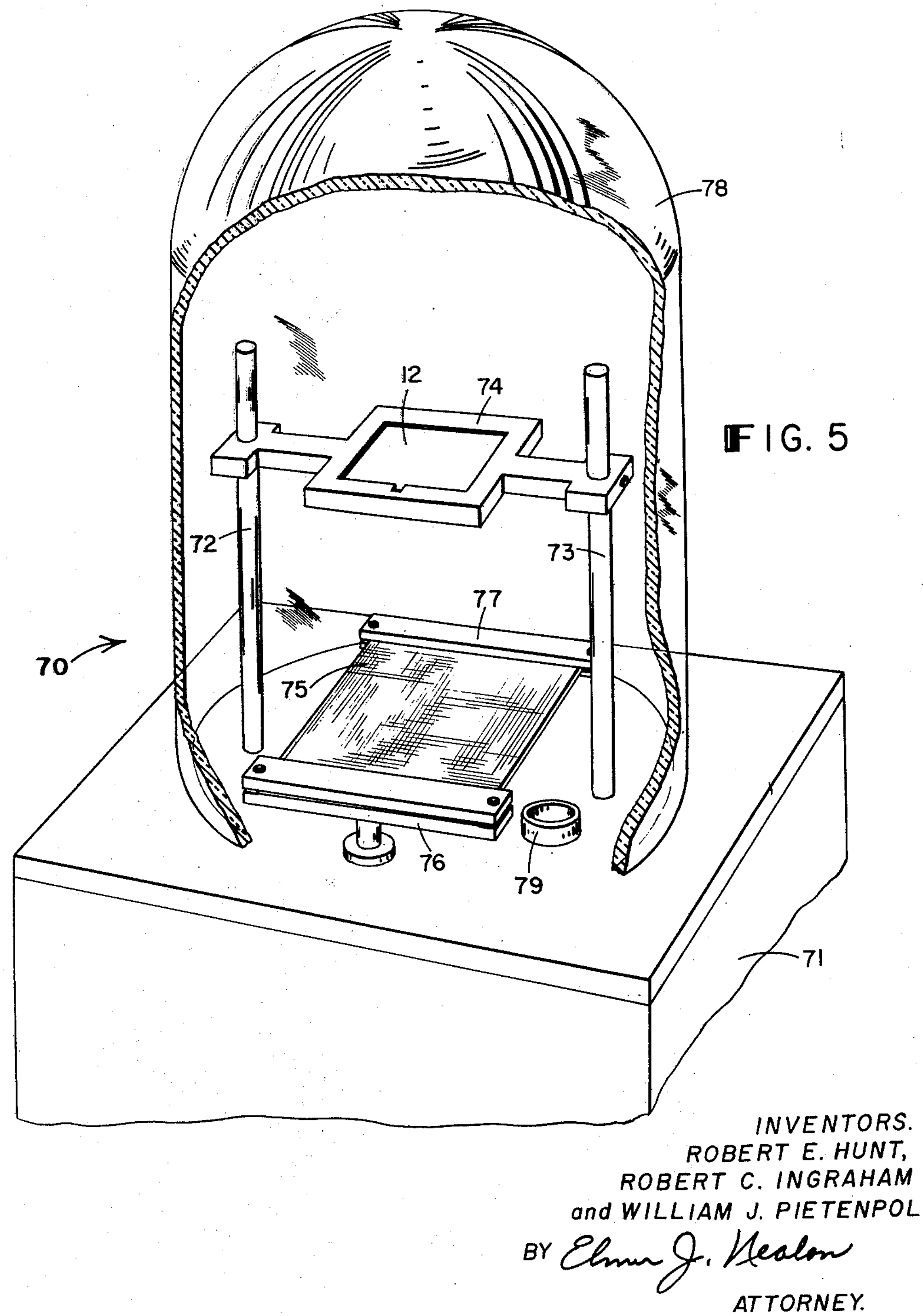
FIG. 5 is a perspective view of apparatus employed in depositing the resistant material defining the mesas on the surface of the slab.

After the germanium slab has cooled and the evacuated chamber has returned to normal pressure, the masked slab is placed in the evaporation apparatus 70 shown in FIG. 5. The wax source 75 is a wire mesh screen which has been coated with a fluorocarbon wax sold under the trade name KEL–F 200 by Minnesota Mining and Manufacturing Company, St. Paul, Minnesota. The dimensions of the source are about 8 inches along the 1 mil dimensions of the mask apertures and about 4 inches in the 6 mil dimensions of the apertures. The wax source is located approximately 5 inches from the masked slab. The apparatus is evacuated to a pressure of $10^{-5}$ millimeters of mercury or less and current is passed through the clamps 76 and 77 and the screen to cause the wax to evaporate and condense on the slab. The size of the wax deposits 80 defining a mesa over each pair of stripes is approximately 5 mils by 8 mils.

Next, the slab is removed from the masking jig and immersed in an etching solution consisting of:

360 milliliters of acetic acid (99.6% $HC_2H_3O_2$),
180 milliliters of hydrofluoric acid (48% HF),
450 milliliters of nitric acid (69.5% $HNO_3$), and
3 grams of iodine.

The slab is immersed for a period of 15 seconds and then is suitably rinsed and dried. This etching step dissolves about 0.5 mil of the germanium slab from each exposed surface while leaving a pedestal or mesa in the region beneath each wax deposit. A film of wax is then evaporated over the entire mesa face of the slab, and the slab is immersed in an etching solution consisting of:

396 milliliters of acetic acid (99.6% $HC_2H_3O_2$),
180 milliliters of hydrofluoric acid (48% HF),
360 milliliters of nitric acid (69.5% $HNO_3$), and
1 gram of iodine.

The slab is etched for about three minutes to reduce the thickness of the slab to about 3 mils. The slab is washed in trichloroethylene to remove the resistant wax coating.

A mask for defining the area of each die is then placed directly in contact with the mesa face of the slab. This mask has rectangular apertures of 20 mils by 40 mils each of which is arranged to register with one of the mesas. A film of wax is evaporated onto the masked surface, the mask removed, and the slab immersed in an etching solution which consists of:

280 milliliters of acetic acid (99.6% $HC_2H_3O_2$),
280 milliliters of hydrofluoric acid (48% HF),
420 milliliters of nitric acid (69.5% $HNO_3$), and
14 milliliters of silver nitrate solution (1% $AgNO_3$).

The individual dice are formed by the separation of the slab into dice as the unprotected regions of germanium dissolve. In from 35 to 70 seconds dice of about 1.5 mils thickness are formed. The wax is removed from the dice by washing them in trichloroethylene. Each die or element is then mounted on a gold-plated header 95 by brazing in a hydrogen furnace at 380° C. Gold wire contacts 100 and 101 of 0.4 mil diameter are bonded to the stripes and the leads 99 and 98 to provide base and emitter connections. The device is then etched and cleaned, and a cap is welded to the base of the header in accordance with usual processing techniques.

As is apparent from the foregoing discussion, in the production of mesa transistors according to the method of the invention all of the mesas are formed in a slab of semiconductor material simultaneously prior to separation of the slab into individual dice. Excellent registration is obtained between each mesa and its associated pair of stripes by employing the same mask for forming the stripes and for defining the mesas. Compensation for slight imperfections in the mask is thereby automatically achieved. In addition, hundreds of mesas are accurately defined and formed on a slab at one time, and individual application of the resistant film defining the mesa on each die is avoided.

What is claimed is:

1. The method of producing semiconductor devices including the steps of placing a mask having a plurality of apertures therein at a predetermined distance from a surface of a body of semiconductor material, depositing a conductivity type imparting material on said surface through each of said plurality of apertures, the conductivity type imparting material deposited through each of said apertures defining a different one of a like plurality of first regions on said surface coated by said material, heating to cause penetration of said material into said body at each of said first regions, depositing a resistant material through each of said plurality of apertures, the resistant material deposited through each of said apertures defining a different one of a like plurality of second regions on said surface coated by said resistant material each of which includes the first region defined by the conductivity type imparting material deposited through the same aperture, immersing said body in an etching medium capable of dissolving said semiconductor material but not said resistant material thereby to form in said body a plurality of pedestals each including one of said first regions, and subsequently dividing said body into a plurality of individual elements each including one of said pedestals.

2. The method of producing semiconductor devices including the steps of placing a mask having a plurality of apertures therein at a predetermined distance from a surface of a body comprising semiconductor material of one conductivity type and having a layer of semiconductor material of the opposite conductivity type at said surface, depositing through each of said plurality of apertures and alloying with said layer a first conductivity type imparting material and a second conductivity type imparting material capable of imparting the type of conductivity opposite to said first material, the conductivity type imparting materials deposited through each of said apertures defining a different one of a like plurality of pairs of regions on said surface, one region of each of said pairs of regions containing the first material and the other region of each pair containing the second material, depositing an etch resistant material through each of said plurality of apertures, the etch resistant material deposited through each of said apertures defining a different one of a like plurality of separate areas on said surface coated with said resistant material each including the one of said pairs of regions defined by the conductivity type imparting materials deposited through the same aperture, immersing said body in an etching solution capable of dissolving said semiconductor material but not said resistant material to form a plurality of pedestals in said body each including one of said pairs of regions, and subsequently dividing said body into a like plurality of individual elements each including one of said pedestals.

3. The method of producing semiconductor devices including the steps of forming a layer of one conductivity type in one surface of a body of semiconductor material of the opposite conductivity type, placing a mask having a plurality of apertures therein at a predetermined distance from said surface, depositing a first material capable of imparting the opposite type of conductivity through each of said plurality of apertures, the first material deposited through each of said apertures defining a different one of a like plurality of separate first regions on said surface coated with said first material, heating said body to alloy said first material with the semiconductor material of said layer and convert portions thereof at said first regions to the opposite conductivity type, depositing a second material capable of forming an ohmic connection to the semiconductor material of the one conductivity type through each of said plurality of apertures, the second material deposited through each of said apertures defining a different one of a like plurality of separate second regions on said surface coated with said second material each lying closely adjacent and spaced from the one of said first regions defined by the first material deposited through the same apertures thus establishing a plurality of pairs of regions, heating said body to alloy said second material with the semiconductor material of said layer and form ohmic connection to said layer at each of said second regions, depositing an etch resistant material through each of said plurality of apertures, the etch resistant material deposited through each of said apertures defining a different one of a like plurality of separate areas on said surface coated with said resistant material each including the one of said pairs of regions established by the first and second materials deposited through the same aperture, immersing said body in an etching solution capable of dissolving said semiconductor material but not said resistant material to form a plurality of pedestals in said body each including one of said pairs of regions, and subsequently dividing said body into a like plurality of individual elements each including one of said pedestals.

4. The method of producing semiconductor devices including the steps of forming a layer of one conductivity type in one surface of a body of semiconductor material of the opposite conductivity type, placing a mask having a plurality of apertures therein at a predetermined distance from said surface, evaporating a first material capable of imparting the opposite type of conductivity from substantially a point source located beyond the mask with respect to the body and on one side of a center line thereof to cause first material to pass from the point source through each of said plurality of apertures, the first material passing through each of said apertures defining a different one of a like plurality of first regions on the surface of the body coated with the first material, treating said body to form rectifying barriers in said body at each of said first regions, evaporating a second material capable of forming an ohmic connection to the semi-conductor material of the one conductivity type from substantially a point source also located beyond the mask with respect to the body but on the other side of said centerline of the body to cause second material to pass from the point source through each of said plurality of apertures, the second material passing through each of said apertures defining a different one of a like plurality of second regions on the surface of the body coated with the second material, each second region lying closely adjacent and spaced from the one of said first regions defined by the first material passed through the same aperture and establishing a plurality of pairs of regions, treating said body to form ohmic connections to said body at each of said second regions, evaporating an etch resistant wax from an area source having dimensions to cause a like plurality of areas on the surface of the body to be coated with said resistant wax passing from the area source through each of said plurality of apertures, the resistant wax passing through each of said apertures defining a different one of the like plurality of areas, each area including the one of said plurality of pairs of regions established by the first and second materials passed through the same aperture, immersing said slab in an etching solution capable of dissolving the semiconductor material but not the resistant wax for a period of time sufficient to dissolve said layer of semiconductor material except those portions protected by the resistant wax whereby a plurality of mesas each including one of said pairs of regions is formed in said body, and subsequently dividing said body into a like plurality of individual dice each including one of said mesas.

5. The method of producing semiconductor devices including the steps of forming a layer of one conductivity type in a surface of a slab of semiconductor material of the opposite conductivity type, placing a mask having a plurality of similar apertures therein at a predetermined distance from said surface, establishing substantially a first point source and substantially a second point source each source spaced equidistant from the surface of the masked slab and spaced apart a distance greater than the dimension of the slab along the direction of the slab parallel to a line connecting the sources, placing a charge of a first material capable of imparting the opposite type of conductivity at the first point source, placing a charge of a second material capable of forming an ohmic connection to semiconductor material of the one conductivity type at the second point source, establishing an evacuated space surrounding the masked slab and said sources, heating one of said charges to evaporate the material of the charge whereby vapors of the material pass through each of said plurality of apertures in said mask and condense on the surface of the slab, the vapors of the material passing through each of said apertures and condensing on the surface of the slab defining a different one of a like plurality of first regions on the surface of the slab coated with the material, heating said slab to alloy the material with the semiconductor material of said layer of the one conductivity type of semiconductor material and then permitting the slab to cool, heating the other of said charges to evaporate the material of the charge whereby vapors of the material pass through each of said plurality of apertures in said mask and condense on the surface of the slab, the vapors of the material passing through each of said apertures and condensing on the surface of the slab defining a different one of a like plurality of second regions on the surface of the slab coated with the material, each second region lying closely adjacent and spaced from the one of said first regions defined by material passed through the same aperture and establishing a like plurality of pairs of regions, heating said slab to alloy the material with the semiconductor material of said layer of the one type of semiconductor material and then permitting the slab to cool, establishing an area source having resistant wax thereon spaced from the surface of the masked slab and extending outward beyond lines drawn from each of said plurality of apertures through each of said point sources, establishing an evacuated space surrounding the masked slab and said area source, heating said area source to evaporate the wax whereby vapors of the wax pass through each of said plurality of apertures in said mask and condense on the surface of the slab, the vapors of the wax passing through each of said apertures and condensing on the surface of the slab defining a different one of a like plurality of areas on the surface of the slab coated with the wax, each area including the one of said plurality of pairs of regions established by the materials passed through the same aperture, separating said slab and said mask, immersing said slab in an etching solution capable of dissolving the semiconductor material but not the wax for a period of time sufficient to dissolve the layer of semiconductor material of the one conductivity type except those portions thereof protected by the wax whereby a plurality of mesas each including one of said pairs of regions are formed in said slab, and subsequently dividing said slab into a like plurality of individual elements each including one of said mesas.

6. The method of producing mesa transistors including the steps of diffusing a material capable of imparting one type of conductivity into a layer adjacent one of the major surfaces of a slab of semiconductor material of the opposite conductivity type, placing a mask having a plurality of similar rectangular apertures uniformly arranged therein at a predetermined distance from said surface, positioning a first filament for serving as substantially a first point source and a second filament for serving as substantially a second point source, each equidistant from the surface of the masked slab and spaced apart along a line parallel to the center line of the slab in the direction of the narrow dimensions of the apertures a distance greater than the dimension of the slab in said direction, placing a charge of a first material capable of imparting the opposite type of conductivity in the first filament, placing a charge of a second material capable of forming an ohmic connection to semiconductor material of the one conductivity type in the second filament, establishing an evacuated space surrounding the masked slab and said filaments, heating the first filament to evaporate the charge of said first material whereby vapors of the material pass through each of said plurality of apertures in said mask and condense on the surface of the slab, the vapors of the material passing through each of said apertures and condensing on the surface of the slab forming a different one of a like plurality of stripes of said first material on first regions of the surface of the slab, heating said slab to alloy the stripes of first material with the semiconductor material of said layer of one conductivity type in the first regions and convert portions of the layer to the opposite conductivity type and then permitting the slab to cool, heating the second filament to evaporate the charge of said second material whereby vapors of the material pass through each of said plurality of apertures in said mask and condense on the surface of the slab, the vapors of the material passing through each of said apertures and condensing on the surface of the slab forming a different one of a like plurality of stripes of said second material on second regions of the surface of the slab, each second region lying closely adjacent and spaced from the one of said first regions having a stripe formed by the first material passed through the same aperture and establishing a like plurality of pairs of regions, heating said slab to alloy the stripes of the second material with the semiconductor material of said layer of one conductivity type in the second regions and form ohmic connections thereto and then permitting the slab to cool, positioning a screen having a vaporizable etch resistant wax thereon for serving as an area source spaced from said surface of the masked slab and extending outward beyond lines drawn from each of said plurality of apertures through each of said filaments, establishing an evacuated space surrounding the masked slab and said screen, heating the screen to evaporate the wax whereby vapors of the wax pass through each of said plurality of apertures in said mask and condense on the surface of the slab, the vapors of the wax passing through each of said apertures and condensing on the surface of the slab forming a different one of a like plurality of coated areas on the surface of the slab, each area including the one of said pairs of regions established by the first and second materials passed through the same aperture, removing said mask from said slab, immersing said slab in an etching solution capable of dissolving the semiconductor material but not the wax for a period of time sufficient to dissolve the layer of semiconductor material of the one conductivity type except in the plurality of portions protected by said coated areas whereby a plurality of mesas each including one of said pairs of regions are formed in said slab and subsequently dividing said slab into a like plurality of dice each including one of said mesas.

7. The method of producing P-N-P germanium mesa transistors including the steps of diffusing arsenic into a layer adjacent one of the major surfaces of a slab of P-type single crystal germanium whereby said layer is converted to N-type conductivity, placing a mask having a plurality of similar rectangular apertures uniformly arranged therein at a predetermined distance from said surface, positioning a first filament for serving as substantially a first point source and a second filament for serving as substantially a second point source each equidistant from the surface of the masked slab and spaced apart along a line parallel to the center line of the slab in the direction of the narrow dimensions of the apertures a distance greater than the dimension of the slab in said direction, placing a charge of aluminum in the first filament, placing a charge of a gold-antimony alloy in the second filament, establishing an evacuated space having a pressure of less than $10^{-5}$ millimeters of mercury surrounding the masked slab and said filaments, heating the first filament to evaporate the charge of aluminum whereby vapors of aluminum pass through each of said plurality of apertures in said mask and condense on the surface of the slab, the vapors of aluminum passing through each of said apertures and condensing on the surface of the slab forming a different one of a like plurality of aluminum stripes on first regions of the surface of the slab, heating said slab to about 565° C. to alloy the aluminum stripes with the germanium of said layer of N-type conductivity in the first regions and convert portions of the layer to P-type conductivity and then permitting the slab to cool, heating the second filament to evaporate the charge of gold-antimony alloy whereby vapors of gold and antimony pass through each of said plurality of apertures in said mask and condense on the surface of the slab, the vapors of gold and antimony passing through each of said apertures and condensing on the surface of the slab forming a different one of a like plurality of gold-antimony stripes on second regions of the surface of the slab, each second region lying closely adjacent and spaced from the one of said first regions having a stripe formed by aluminum passed through the same aperture and establishing a plurality of pairs of regions, heating said slab to about 370° C. to alloy the gold-antimony stripes with said layer of N-type conductivity in the second regions and form ohmic connections thereto and then permitting the slab to cool, positioning a wire mesh screen having a vaporizable acid resistant wax thereon for serving as an area source of said wax spaced from said surface of the masked slab and extending outward beyond lines drawn from each of said plurality of apertures through each of said filaments, establishing an evacuated space having a pressure of less than $10^{-5}$ millimeters of mercury surrounding the masked slab and said screen, heating the screen to evaporate the wax whereby vapors of the wax pass through each of said plurality of apertures in said mask and condense on the surface of the slab, the vapors of the wax passing through each of said apertures and condensing on the surface of the slab forming a different one of a like plurality of coated areas on the surface of the slab, each area including the one of said pairs of regions established by the aluminum and gold and antimony passed through the same aperture, removing said mask from said slab, immersing said slab in an acid etching solution capable of dissolving germanium but not the wax for a period of time sufficient to dissolve the layer of germanium of N-type conductivity except in the plurality of portions protected by said coated areas whereby a plurality of mesas each including one of said pairs of regions are formed in said slab and subsequently dividing said slab into a like plurality of dice each including one of said mesas.

8. The method of producing semiconductor devices including the steps of placing a mask having a plurality of apertures therein at a predetermined distance from a surface of a body of semiconductor material having a surface layer of one conductivity type, depositing through each of said plurality of apertures and alloying with said layer a first conductivity type impurity material and a second conductivity type impurity material capable of imparting the type of conductivity opposite to said first material, said first material being deposited from a first substantially point source located beyond the mask with respect to the body and on one side of a center line thereof and said second material being deposited from a second substantially point source located beyond the mask with respect to the body but on the other side of said center line of the body, the materials defining a like plurality of pairs of regions on said surface one region of each of said pairs containing the first material deposited through an aperture and the other region of each pair containing the second material deposited through the same aperture, depositing an etch resistant material through each of said plurality of apertures from an area source spaced from the surface of the mask and extending outward beyond lines drawn from each of the plurality of apertures through each of the point sources, the resistant material deposited through each of said apertures defining a different one of a like plurality of separate areas on said surface each including the one of said pairs of regions defined by the first and second materials deposited through the same aperture, immersing said body in an etching solution capable of dissolving said semiconductor material but not said resistant material to form a plurality of pedestals in said body each including one of said pairs of regions, and subsequently dividing said body into a like plurality of individual elements each including one of said pedestals.

References Cited in the file of this patent

UNITED STATES PATENTS

| | | |
|---|---|---|
| 2,759,861 | Collins | Aug. 21, 1956 |
| 2,870,050 | Mueller | Jan. 20, 1959 |
| 2,890,395 | Lathrop | June 9, 1959 |
| 2,968,751 | Mueller et al. | Jan. 17, 1961 |
| 2,969,296 | Walsh | Jan. 24, 1961 |
| 2,970,896 | Cornelison et al. | Feb. 7, 1961 |